(12) United States Patent
Mages et al.

(10) Patent No.: US 6,178,313 B1
(45) Date of Patent: Jan. 23, 2001

(54) CONTROL OF GAIN AND POWER CONSUMPTION IN A POWER AMPLIFIER

(75) Inventors: Phil Mages, San Diego; John B. Groe, Poway, both of CA (US)

(73) Assignee: Nokia Mobile Phones Limited, Espo (FI)

( * ) Notice: Under 35 U.S.C. 154(b), the term of this patent shall be extended for 0 days.

(21) Appl. No.: 09/223,984

(22) Filed: Dec. 31, 1998

(51) Int. Cl.[7] .................................................. H01Q 11/12
(52) U.S. Cl. ........................ 455/127; 455/91; 455/73; 330/278; 330/285; 330/127
(58) Field of Search ............................. 455/91, 126–127, 455/115, 232.1–234.2, 239.1–241.1, 249.1, 251.1, 253.2; 330/278, 285, 127, 200

(56) References Cited

U.S. PATENT DOCUMENTS

| | | | |
|---|---|---|---|
| 5,287,555 | * 2/1994 | Wilson et al. | 455/127 |
| 5,432,473 | * 7/1995 | Mattila et al. | 455/127 |
| 5,493,707 | * 2/1996 | Kamitani | 455/127 |
| 5,640,691 | * 6/1997 | Davis et al. | 455/127 |
| 5,926,749 | * 7/1999 | Igarashi et al. | 455/127 |

\* cited by examiner

*Primary Examiner*—Doris H. To
(74) *Attorney, Agent, or Firm*—Robert H. Kelly; Holland & Hart LLP (57) ABSTRACT

Gain control apparatus, and an associated method, for a radio transmitter, such as the radio transmitter forming a portion of a mobile station. Gain control is effectuated by controlling the level of bias current at which a power amplifier is biased. Signals to be transmitted by the radio transmitter are also applied to the power amplifier to be amplified thereat. Because the gain of a power amplifier is directly proportional to the bias level at which the amplifier is biased, gain control is effectuated through control of the bias current by which the power amplifier is biased.

10 Claims, 7 Drawing Sheets

CONTROL OF GAIN AND POWER CONSUMPTION IN A POWER AMPLIFIER

The present invention describes a control method for both power amplifier (PA) gain and power consumption. More particularly, the present invention describes how this control is accomplished by the bias current applied to the power amplifier. Incremental adjustment of the bias current level applied to the power amplifier causes a corresponding incremental change in the gain of the power amplifier. And, the bias current of the power amplifier can be selected to be no higher than necessary, thereby minimizing power consumption of the transmitter.

BACKGROUND OF THE INVENTION

Wireless communication systems have become widely popular in recent years. Advancements in communication technology have permitted the development, and popular usage, of new types of communication devices, of improved performance, portability, and affordability.

In a wireless communication system, a radio communication channel extends between a sending station and a receiving station. The radio channel is defined upon a portion of the electromagnetic spectrum. This communication link between the sending and receiving stations is wireless and can thereby be untethered.

A cellular communication system is exemplary of a wireless, multi-user communication system. Here, several fixed-site base stations are installed to cover a geographical area. By transmitting signals with controlled power, the same frequencies can be re-used at different locations throughout the geographical area. Thereby, communication capacity is maximized power control is at the core of cellular system design.

Various standards have been developed for cellular communication systems. Interim Standard IS-95, promulgated by the EIA/TIA, is exemplary of a standard which pertains to a cellular communication system utilizing CDMA (code-division, multiple access) communication techniques. In a CDMA communication system, several communication signals share a common frequency channel. In such a communication scheme, the power levels of each user must be regulated to achieve optimal capacity. Power control is needed to ensure that none of the signals overwhelm the other signals.

Power control is used to ensure that transmitted communication signals are strong enough to recover the informational content at the receiver, but also low enough to not reduce the communication capacity of the communication channel. Most communications systems utilize closed-loop power control schemes. In the closed-loop power control scheme defined in the IS-95 standard, power control bits are generated and transmitted by network infrastructure on the forward link channel to a radio telephone. These power control bits control the power levels for the reverse link communication signals transmitted by the radio telephone. Therefore, a method is needed to change the power level of the transmitter. Several technical challenges are presented by the power control bit rate and the accuracy requirements of IS95.

Most radio telephones are powered by portable power supplies or batteries. These batteries store limited energy, and therefore need to be replaced or recharged regularly. It is also advantageous to minimize the power requirements of the radio telephone. By reducing the power required to operate the radio telephone, the discharge rate for the stored energy of a battery pack is reduced. Thereby the time period during which a single battery pack can be utilized to power the radio telephone can be increased. That is to say, a technical challenge exists to provide manners by which to increase the "talk time" of the radio telephone with a single battery pack.

The transmitter portion of a radio telephone typically includes a power amplifier. The power amplifier amplifies a reverse link signal prior to its transmission so that it will be received by a base station via a radio channel. A power amplifier requires relatively large amounts of energy for its operation. Conventionally, power amplifiers are powered or biased to accommodate the maximum power levels transmitted by the radio telephone. However, in an IS-95, the typical power levels of reverse link signals are generally significantly less than the maximum power levels.

A manner to provide control of gain and power consumption in a power amplifier is advantageous.

A manner by which to utilize the power amplifier to effectuate power control in a two-way power control scheme is also advantageous.

It is in light of this background information related to transmitter circuits, that the significant improvements of the present invention have evolved.

SUMMARY OF THE INVENTION

The present invention advantageously provides a method to control the gain and power consumption of a power amplifier using its bias current.

In one aspect of the present invention, advantage is taken of the relationship between the level of gain exhibited by the power amplifier and the level of bias current applied to the amplifier. By increasing the level of bias current applied to the power amplifier, a corresponding increase in the gain of the power amplifier is exhibited. Analogously, a decrease in the level of bias current applied to the power amplifier causes a corresponding decrease in the level of gain exhibited by the power amplifier.

In one implementation, gain control is directed by closed loop information in the form of power control bits. Those power control bits are received by the radio telephone. In response to the received commands, a gain controller alters the level of bias current applied to the power amplifier. The power amplifier forms a portion of the transmitter portion of the two-way transceiver and the gain of the power amplifier is determined in part by the desired transmit power level.

In another implementation, the power lever transmitted is controlled by the gain of a variable gain amplifier (VGA) and a power amplifier. The power control commands are provided to a gain controller. The gain controller, in turn, adjusts the level of amplification of the variable gain amplifier and also the level of bias current applied to the power amplifier. The combination of commands issued by the gain controller direct the signals generated by the transmitter to be of desired power levels.

In one embodiment of the present invention, the gain controller includes a memory element with values of bias current and the corresponding levels of PA gain. The desired PA gain is first determined. From this, the corresponding bias current read from memory and applied to the PA. In an embodiment in which gain control is jointly controlled by a power amplifier and a variable gain amplifier, the memory element is capable of storing additional information related to the variable gain amplifier.

Reduction in the gain of the power amplifier so that the transmitted power level just adequately forms the radio link ensures battery energy is not wasted and interference is minimal.

The power amplifier has an input terminal where the communication signal is applied and an output terminal where the amplifier communication signal is generated. The power amplifier amplifies the communications signal at a level selected by the bias current, generated by the gain controller.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION

Figure 1:
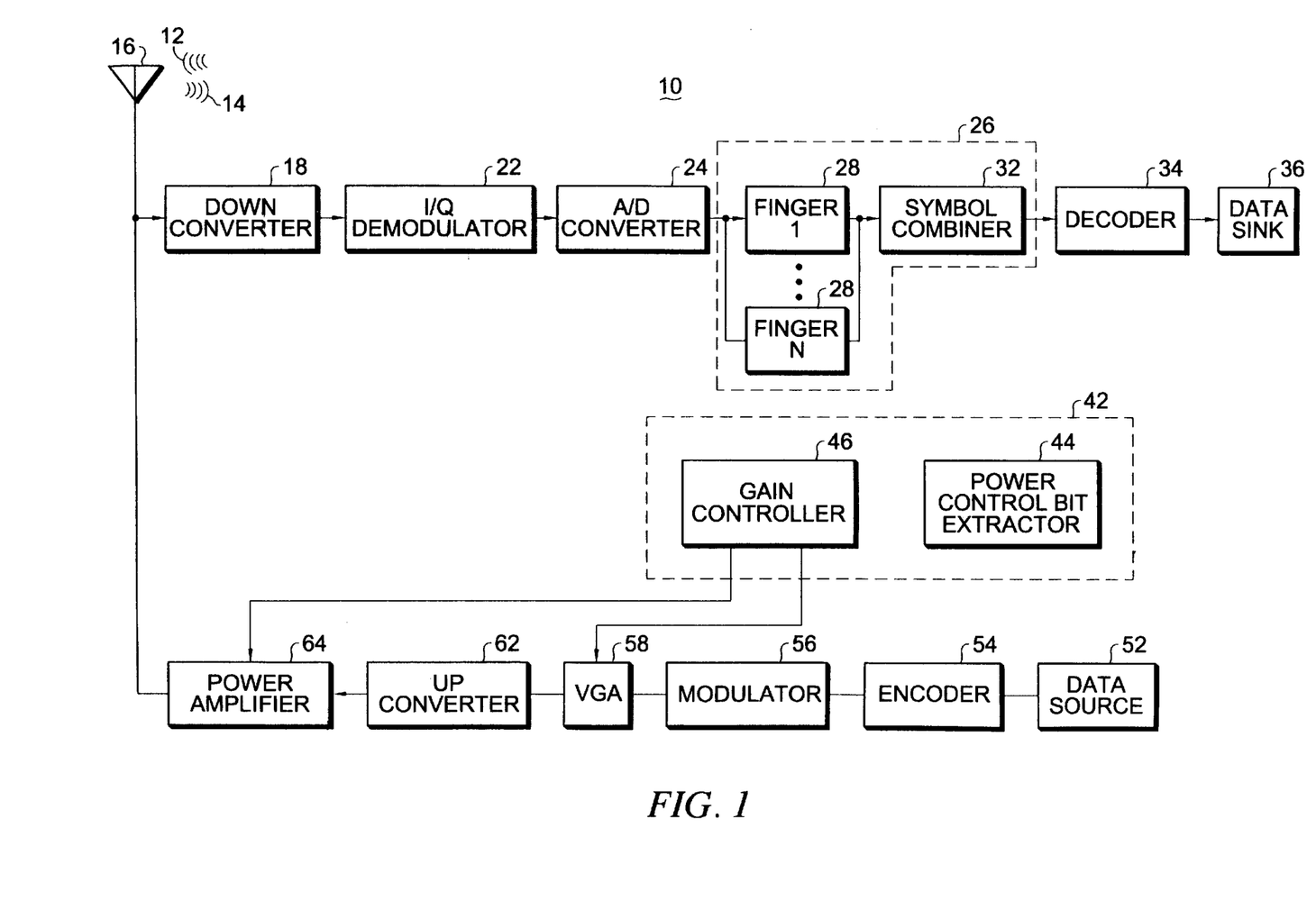
FIG. 1 illustrates a functional block diagram of a radio transceiver in which an embodiment of the present invention forms a portion.

A mobile station 10 where the present invention is operable is shown in FIG. 1. In conventional manner, the mobile station 10 is selectively tuned to receive signals 12 transmitted upon a forward link channel to the mobile station. Included amongst the signals transmitted to the mobile station are power control bits, used at the mobile station to select the power levels for the reverse-link signals 14 generated by the mobile station.

Electromagnetic signals 12 are detected by an antenna transducer 16 which converts the signals into electrical form and provides them to a down converter 18. The down converter 18 down converts the signals provided to the IF frequency level. The signals, once down converted to the IF frequency, are provided to an I/Q demodulator 22. The demodulator generates I- and Q-baseband signals which are applied to analog-to-digital converters 24. The converters 24 convert these signals into digital form and provides such digitized signals to a rake receiver 26.

The rake receiver 26 includes a plurality of dynamically assigned fingers 28 and a symbol combiner 32. Here, two fingers 28 are shown; in other implementations, other numbers of fingers are dynamically assigned. The fingers 28 detect received signals and power control bits. The received signals are then provided to the symbol combiner 32. The symbol combiner combines the results of each finger. The power control bits are extracted directly.

A decoder 34 is coupled to the symbol combiner 32 which decodes received information and provides such symbols to a data sink 36, such as an acoustic transducer.

The mobile station also includes a controller 42 and processing device, or a combination thereof. The controller includes a power control bit extraction unit 44 which is coupled to the symbol combiner 32. As illustrated, the controller 42 further includes a gain controller 46 which generates gain control signals that set the transmit power levels for the reverse-link.

The mobile station 10 further includes a transmit portion, here shown to include a data source 52, an encoder 54, and a modulator 56. The transmit portion of the mobile station further includes a VGA (Variable Gain Amplifier) 58 to amplify the modulated signal formed by the modulator 56, an up-converter 62 for up-converting the amplified signal formed by the VGA 58, and a power amplifier 64 for amplifying the up-converted signal. Amplified signals generated by the power amplifier 64 are provided to the antenna transducer 16 and transduced into electromagnetic form.

The gain controller 46 generates gain control signals on the line 66 which are applied to the power amplifier 64 in a manner to control the level of bias current for the power amplifier 64. The level of bias current for the power amplifier sets its amplification level and the output power of the transmitter.

In one implementation of an embodiment of the present invention, the bias current of the power amplifier is controlled by a current source circuit used to set the reference current applied to the amplifier. The gain of the amplifier is a direct function of the reference current applied to the amplifier, and precise gain control can be achieved thereby. For instance, by reducing the reference current from 5 mA to 1 mA, the bias current is reduced to about 50 mA and a 7 dB gain decrease results. The gain decrease can be used to vary the output power continuously, pursuant to an AGC scheme, or can be compensated by a single step change to maintain an output power level.

In the figure, the gain controller 46 also generates gain control signals on the line 68 which are applied to the VGA 58 to control the amplification level of this amplifier 58. In this embodiment, the power levels of the reverse-link signals generated by the mobile station are determined by a combination of the bias current of the power amplifier 64 and also the amplification level of the VGA 58.

Figure 2:
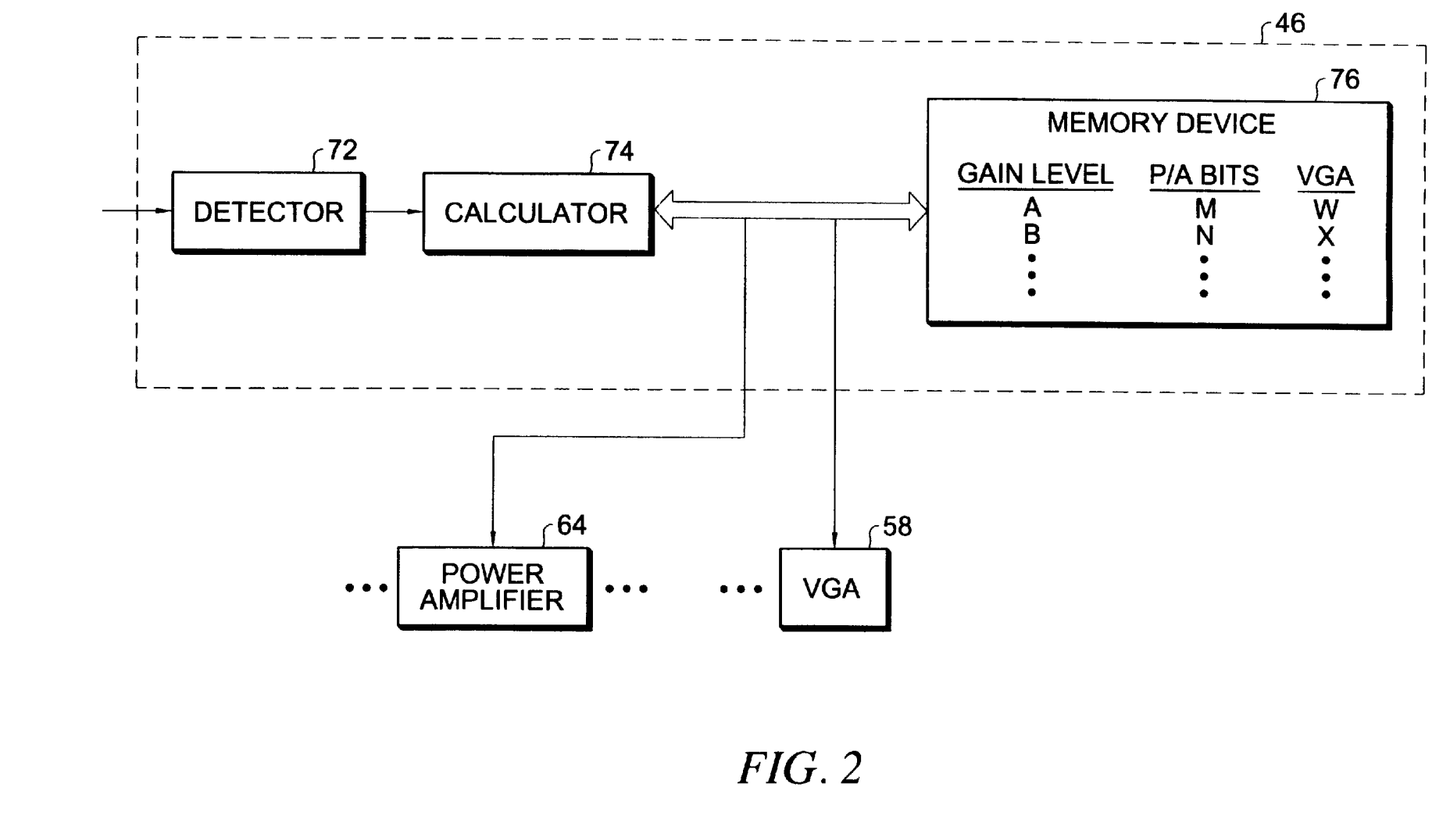
FIG. 2 illustrates a functional block diagram of a portion of the gain control circuitry of an embodiment of the present invention.

FIG. 2 illustrates the gain controller 46 of the present invention. Here, the gain controller includes a detector 72 to receive the power control bits extracted by the power control bit extractor 44 (shown in FIG. 1). The detector 72 retrieves the values of the power control bits and provides indications of these to a calculator 74. The calculator 74 determines the level of gain for the reverse-link signals using the power control bits. Memory locations of a memory device 76 are accessed accordingly. The memory device indexes gain levels of the power amplifier 64 (shown in FIG. 1), together with the corresponding bias current levels. The power amplifier 64 is then biased with the appropriate bias current level. In an implementation where both the bias current of the power amplifier and the amplification level of the VGA 58 (shown in FIG. 1) are changed, the memory device 76 also includes the amplification level of the VGA.

Figure 3:
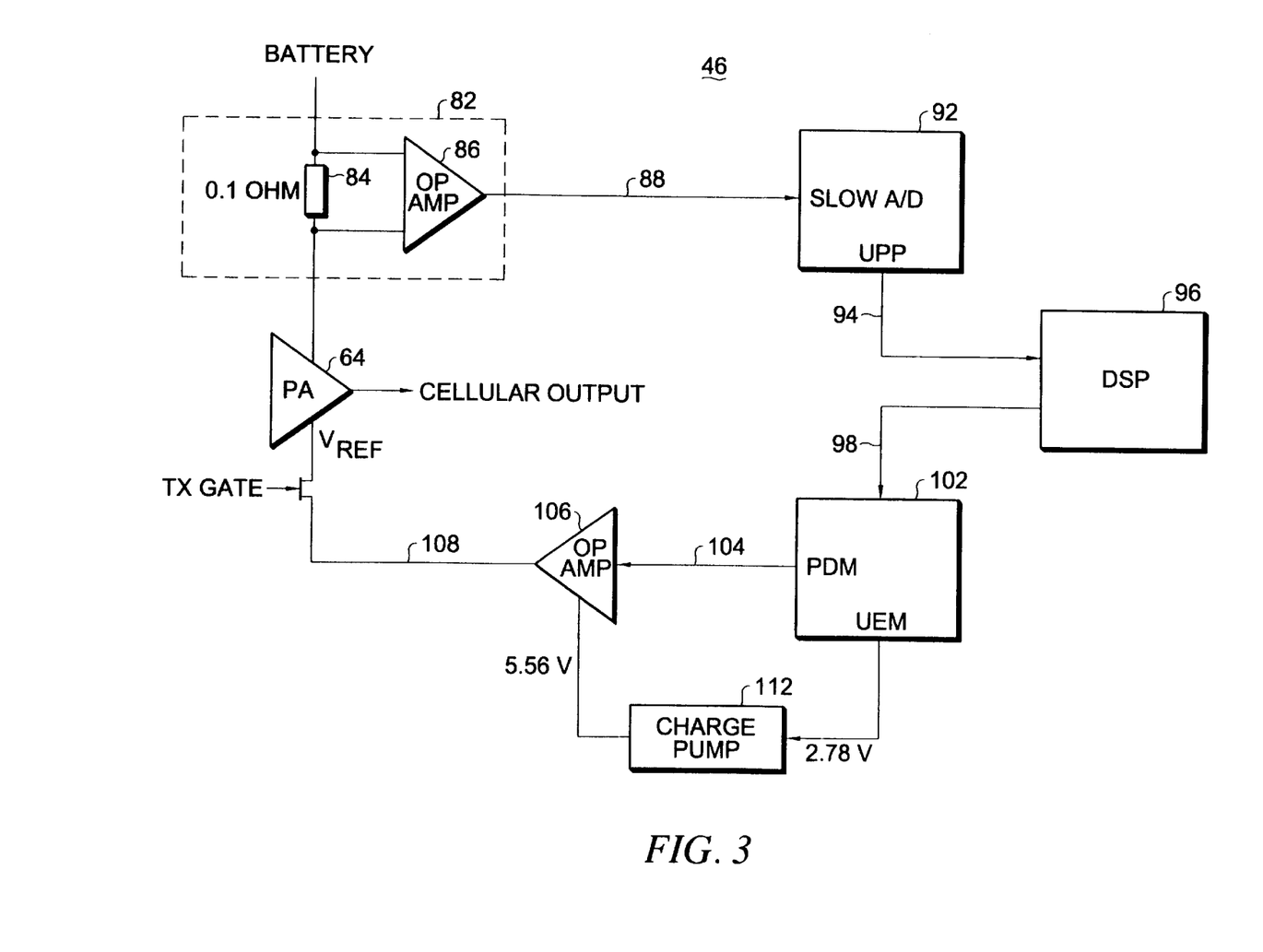
FIG. 3 illustrates a functional block diagram of a portion of the gain control circuit of another embodiment of the present invention.

FIG. 3 illustrates another embodiment of the gain controller 46 together with the power amplifier 64, shown previously in FIG. 1. The gain level of the power amplifier 64 is a direct function of the bias current at which the amplifier is biased. Precise gain control is accomplished by monitoring and controlling the bias current level applied to the amplifier. By lowering the reference voltage, the bias current and gain of the amplifier are altered. For instance, by lowering the reference voltage from 5 volts to 4 volts, the bias current is reduced by approximately 50 milliamperes (mA), and a 10 dB gain decrease of the amplifier results. The change in gain can be used either to vary the output power of a reverse-link signal continuously or to reduce battery drain by shifting transmit gain to the VGA, keeping the same TX power level.

In a variable gain implementation, the amplifier 64 will directly vary the mobile station's output power over a 10–15 dB range. The amplifier can control the mobile station's output power from approximately zero to +15 dBm in response to the AGC algorithm. Alternately, in a single step compensation implementation, the amplifier's gain is reduced in a 10 to 15 dB step while simultaneously increasing the output power of the VGA by an equal step.

In the embodiment illustrated in FIG. 3, the gain controller 46 includes, among other things, a sensing circuit 82. The sensing circuit includes a sensing resistor 84, here 0.1 ohm, coupled across the input terminals of an operational amplifier 86. The amplifier 86 forms a current-sensing, differential operational amplifier for monitoring the bias current applied to the amplifier 64. Signals generated by the amplifier 86 or of the sensing circuit 82 are applied, by way of the line 88, to an A/D circuit 92.

The A/D circuit 92 converts current-sensing voltages into digital signals.

The A/D circuit 92 is coupled by way of lines 94 to a DSP (Digital Signal Processor) 96. An algorithm executable by the DSP 96 compares the digitized sense voltages generated on the line 94 to a predetermined tuned value. In response to comparisons performed by the algorithm, signals are generated on the line 98 for application to a PDM (pulse density modulator) circuit 102. The PDM 102 is instructed either to increase or to decrease the reference voltage of the power amplifier 64 to achieve the desired amplifier bias current.

The gain controller 46 is further shown to include a PDM-to-reference voltage conversion circuit. This may not be necessary and depends on whether the PDM can supply the reference voltage. A signal generated by the PDM 102 on the line 104 is applied to the input of an operational amplifier 106. The amplifier 106 is operable to boost the signal applied thereto to the required voltage reference range on the line 108. The reference voltage typically uses less than 5 mA.

Thereby, the bias current level applied to the power amplifier 64 is controlled by a feedback loop.

In a further embodiment of the present invention, the efficiency of a power amplifier is improved by tailoring its quiescent current to the output power level of the reverse-link signal. In a typical power amplifier, the quiescent current is modified by the RF input power and an improvement at higher RF output power levels is obtained. However, in a typical power amplifier there is no improvement at low to moderate RF output levels.

In a CDMA communication system, the transmitted power of reverse-link signals is controlled by the base station through power control bits. Typically, power control tries to equalize the received power of the reverse-link signals at the base station from all mobile stations operable in the communication system. A probability distribution of the transmitted power levels of the reverse-link signals generated by the mobile station can be formed. While the actual distribution is dependent upon environmental conditions, generally, a mobile station operates at medium power levels a majority of the time. In such a region of operation, the quiescent current of a typical power amplifier is constant.

Figure 4:
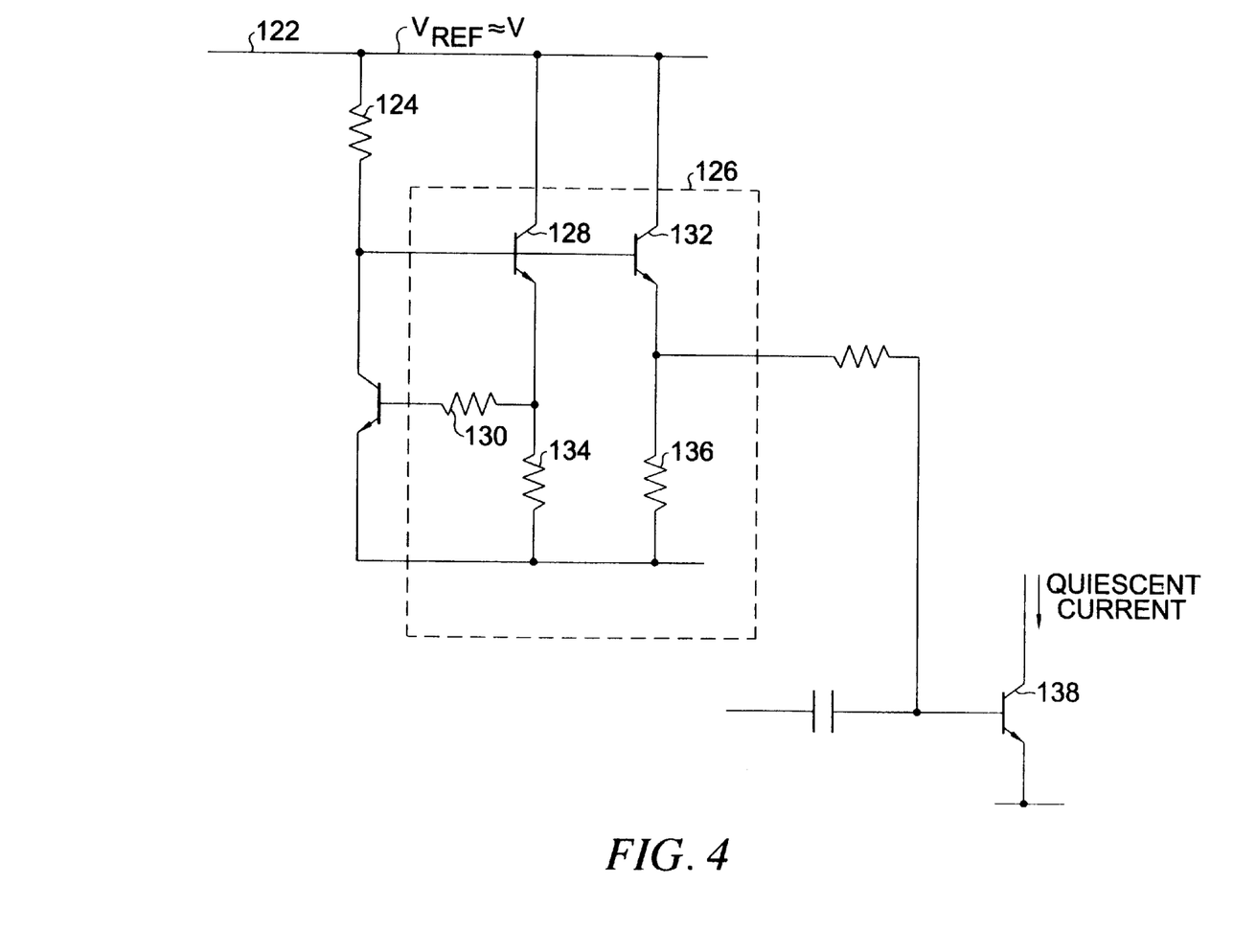
FIG. 4 illustrates a circuit schematic of a portion of the circuitry of an embodiment of the present invention.

FIG. 4 illustrates the bias network of a typical power amplifier. In the figure, a reference voltage formed on the line 122 is of a fixed value, here 5 volts. The voltage reference is converted into a current by way of a resistor 124. The current is mirrored by a current mirror circuit 126, including transistors 126, 128, and 132 and resistors 130, 134, and 136. A quiescent current is thereby applied to an RF signal device, here the amplifier transistor 138.

Figure 5:
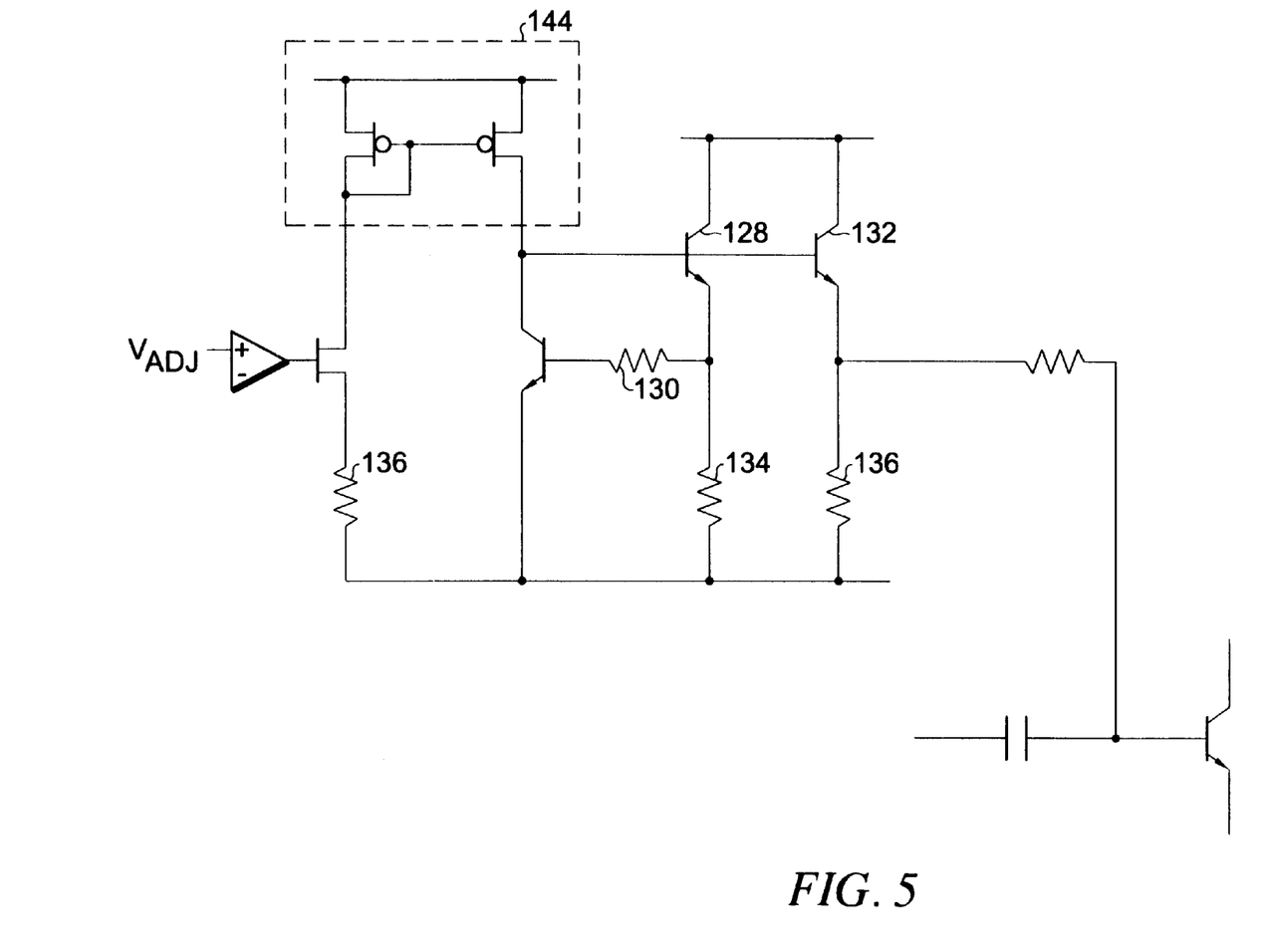
FIG. 5 illustrates a circuit schematic, similar to that shown in FIG. 4, but of a portion of another embodiment of the present invention.

FIG. 5 illustrates a power amplifier bias network of an embodiment of the present invention. Here, in substitution for the voltage reference 122 and resistor 124 of the bias network shown in FIG. 3, a variable current source and current mirror 144 is used to control the PA bias current. By utilizing the variable current source 144, the quiescent bias current is adjustable to provide improved efficiency at medium RF output power levels. Additionally, the required supply voltage is reduced, here to approximately 3 volts, permitting low-voltage implementations, and the temperature coefficient of the bias network is more easily compensated.

Figure 6:
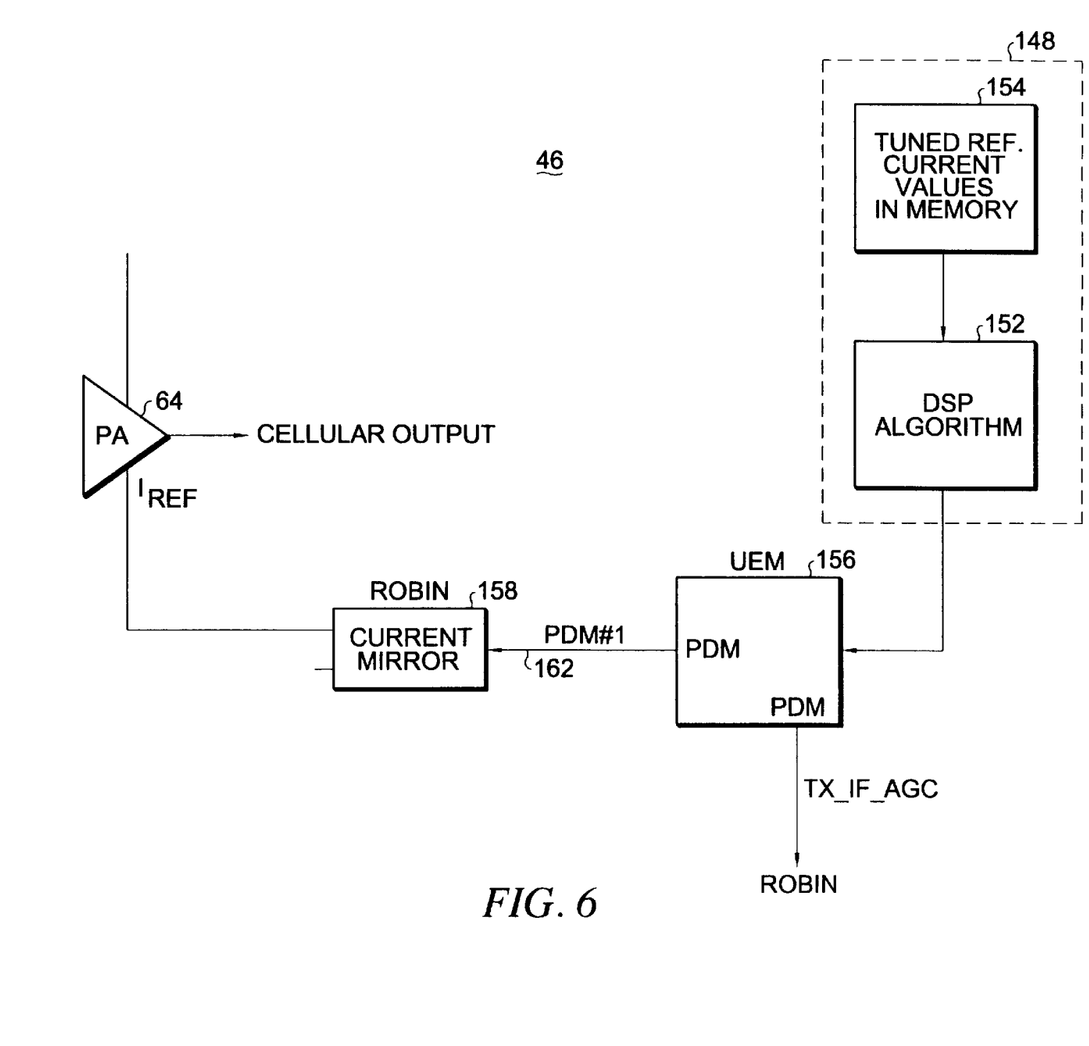
FIG. 6 illustrates a functional block diagram of a portion of the gain control circuit of another embodiment of the present invention.

FIG. 6 illustrates the gain controller 46 of another embodiment of the present invention, together with the power amplifier 64, shown previously in FIG. 1, to form a portion of the mobile station 10. Also in this embodiment, the gain level of the power amplifier 64 is a direct function of the reference current of the amplifier and therefore precise gain control is available. Again, also in this embodiment, the control can be used to vary gain or power consumption.

The gain controller includes a DSP 148, here illustrating a DSP algorithm 152 and a software lookup table 154. The lookup table 154 contains tuned reference current values. Such reference current values are determined during production tuning by measuring power amplifier gain reduction for a predetermined series of decreasing reference current values.

When executed, the DSP algorithm 152 provides gain changes. The DSP algorithm 152 knows the transition level, approximately +10 dBm, at which to start reducing the gain of the amplifier 64. Either an RF power detector (not shown) or a transmitter counter open-loop estimate, can be used to identify the transition level. Compensation can be made for temperature and frequency gain variations by adjusting the reference current using an analogous software lookup table.

The DSP 148 is coupled to a PDM 156. The PDM 156 is used to control a current source 158 by way of signals generated on the line 162. The gain of the amplifier 64 varies with changes in the reference current.

Figure 7:
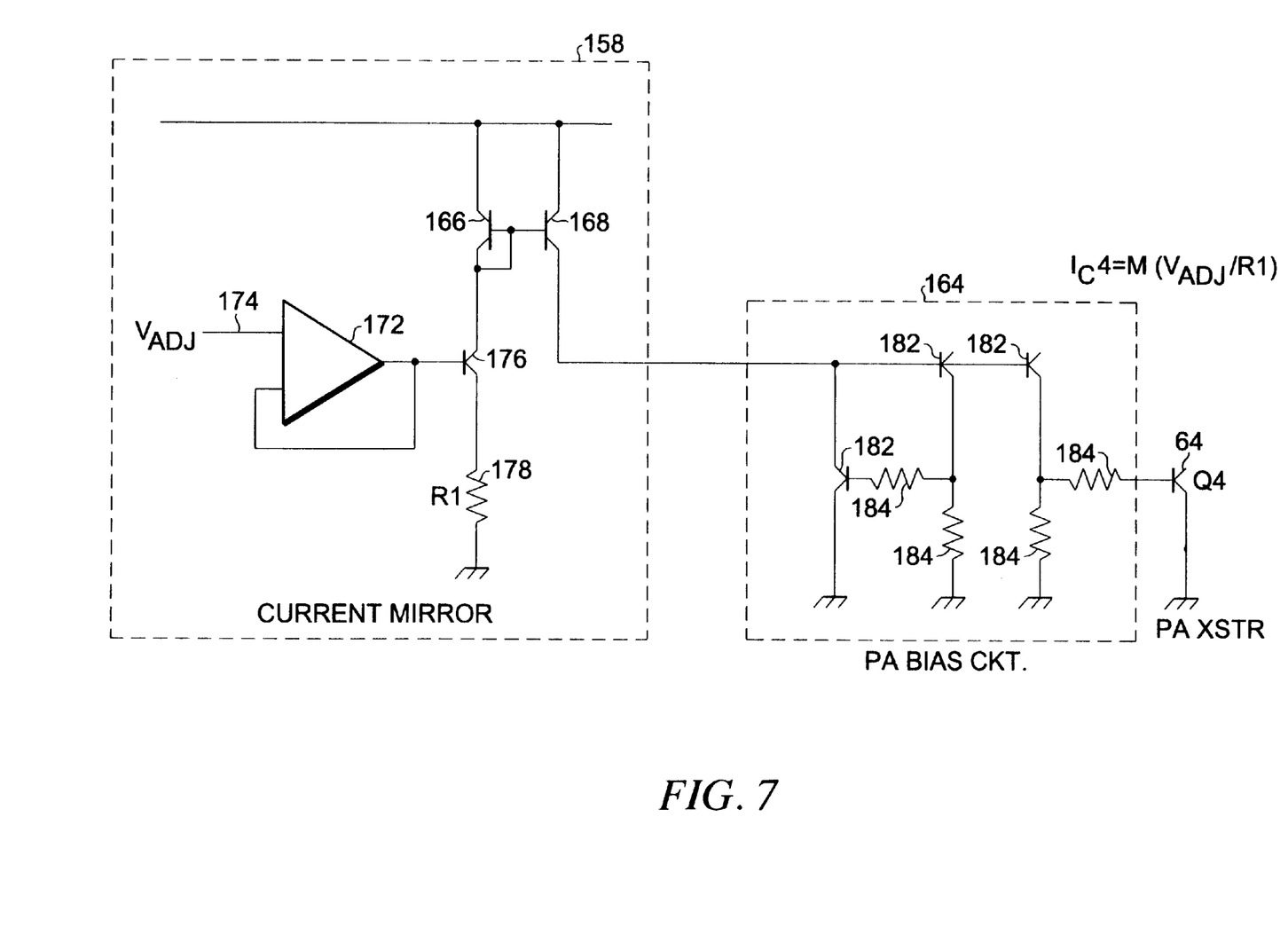
FIG. 7 illustrates a circuit diagram of portions of the gain control circuit shown in FIG. 6.

FIG. 7 illustrates the current source 158 together with biasing circuitry 164, used to bias the power amplifier 64.

The current source 158 is here shown to include a pair of transistors 166 and 168 together coupled in a conventional current-mirror configuration. An amplifier 172 includes a first input at which an adjustable reference voltage is provided on a line 174, and a second input coupled in a feedback arrangement by way of a line from the output of the amplifier 172. The output of the amplifier 172 is coupled to a base terminal of a transistor 176 which is coupled between the transistor 166 and ground potential by way of a resistor 178. The biasing circuitry 164 is here shown to include three transistors 182 and four resistors 184. Signals generated by the biasing circuitry are used to bias the amplifier 64.

In a bipolar transistor, the intrinsic device gain is proportional to its collector current under small signal conditions. These conditions are comparable to medium or low RF output power levels from the power amplifier. As a result, in addition to the improved efficiency of the power amplifier, the adjustable biasing scheme provided through the use of the variable current source 144 also provides a method to adjust the gain of the power amplifier in a predictable manner.

Through operation of an embodiment of the present invention, the gain of the PA is adjustable by the bias current. Incremental adjustment of the bias current applied to the power amplifier causes a corresponding incremental change in the gain of the power amplifier. By selecting the bias current level of the power amplifier to be no higher than necessary, power consumption of the transmitter is minimized.

The previous descriptions are preferred examples for implementing the invention, and the scope of the invention should not necessarily be limited by this description. The scope of the present invention is defined by the following claims.

In any of the previous embodiments a DAC (digital-to-analog converter) may be substituted for the PDM circuit.

We claim:

1. In a radio transmitter operable to transmit a communication signal, apparatus for selectably amplifying said communication signal prior to transmission thereof comprising
   a variable gain amplifier having an input terminal to which said communication signal is applied and having an output terminal at which a first amplified communication signal is generated, said variable gain amplifier for amplifying said communication signal at a first selected level of gain;
   a power amplifier having an input terminal to which said first amplified communication signal is applied and having an output terminal at which a second amplified communication signal is generated, said power amplifier for amplifying said first amplified, communication signal at a second selected level of gain;
   means providing a power control signal;
   a gain controller having an input coupled to receive said power control signal, having a first output connected to control said first level of gain of said variable gain amplifier, and having a second output connected to control a level of bias current applied to said power amplifier, wherein said gain controller includes a memory element; said memory element storing indications of levels of said power control signal and corresponding gain levels of said variable gain amplifier; and said memory element storing indications of levels of said power control signal and corresponding levels of bias current of said power amplifier;
   said first output of said gain controller operating to vary said first level of gain by which said variable gain amplifier amplifies said communication signal as a function of said power control signal;
   said gain controller operating to vary said second level of gain by which said power amplifier amplifies said first amplified communication signal by varying said level of bias current applied to said power amplifier as a function of said power control signal, and
   transmitting means connected to receive said second amplified communication signal from said output terminal of said power amplifier.

2. The apparatus of claim 1 wherein said gain controller causes changes in said first level of gain of said variable gain amplifier and changes in said level of bias current of said power amplifier such that said communication signal is amplified by selected increments.

3. In a radio transmitter operable to transmit a communication signal, an improvement of apparatus for selectably amplifying the communication signal, said apparatus comprising:
   a power amplifier having an input terminal at which the communication signal is applied and an output terminal at which the communication signal, once amplified, is generated, said power amplifier for amplifying the communication signal at a first selected level of gain;
   a gain controller coupled to said power amplifier, said gain controller for selecting the first selected level of gain at which the power amplifier amplifies the communication signal;
   said gain controller comprising a bias current measurer coupled to said power amplifier, said bias current measurer for measuring levels of bias current applied to said power amplifier; and
   said gain controller further comprising a reference voltage level selector coupled to receive indications of the levels of bias current measured by said bias current measurer, said reference voltage selector operable, responsive to the indications of the levels of the bias current received thereat, to select a reference voltage level to be applied to said power amplifier.

4. The apparatus of claim 3 wherein said reference voltage level selector compares the indications of the levels of the bias current with a selected tuned value, said reference voltage level selecting the reference voltage to be applied to said power amplifier responsive to comparisons between the indications of the levels of the bias current with the selected tuned value.

5. The apparatus of claim 4 wherein reference voltage level selector selects incremental changes of the reference voltage level of selected step sizes responsive to the comparisons.

6. The apparatus of claim 5 wherein the incremental changes of the reference voltage level are of step sizes to cause selected step-level changes of the level of gain at which said power amplifier amplifies the communication signal.

7. A two-way transceiver comprising:
   an antenna;
   a radio receiver connected to said antenna and receiving control signals transmitted to said transceiver, said control signals including at least a power control signal;
   a radio transmitter for receiving communication signals to be transmitted from said transceiver, said radio transmitter comprising;
   a variable gain amplifier having an input terminal to which said communication signals are applied and having an output terminal at which first amplified communication signals are generated, said variable gain amplifier for amplifying said communication signals at a first selected level of gain;
   a power amplifier having an input terminal to which said first amplified communication signals are applied and having an output terminal at which second amplified communication signals are generated, said power amplifier for amplifying said first amplified communication signals at a second selected level of gain;
   a gain controller having an input coupled to receive said power control signal, having a first output connected to control said first level of gain of said variable gain amplifier, and having a second output connected to control a level of a bias current applied to said power amplifier, wherein said gain controller includes a memory element; said memory element storing indications of levels of said power control signal and corresponding gain levels of said variable gain amplifier; and said memory element storing indications of levels of said power control signal and corresponding levels of bias current of said power amplifier;

said first output of said gain controller operating to vary said first level of gain by which said variable gain amplifier amplifies said communication signal as a function of said power control signal;

said gain controller operating to vary said second level of gain by which said power amplifier amplifies said first amplified communication signal by varying said level of bias current of said power amplifier as a function of said power control signal; and means connecting said second amplified communication signal to said antenna.

8. The two-way transceiver of claim 7 operable in a CDMA collection communication system wherein said power control signal comprises power control bits.

9. The two-way transceiver of claim 8 wherein variation of said power control bits provide indications of step-size changes by which said first level of gain of said variable gain amplifier and said level of bias current of said power amplifier are concomitantly changed.

10. A method of selectably amplifying a communication signal at a radio transmitter prior to the transmission thereof by said radio transmitter, said method comprising the steps of:

providing a variable gain amplifier having an input terminal to which said communication signal is applied and having an output terminal at which a first amplified communication signal is generated, said variable gain amplifier for amplifying said communication signal at a first selected level of gain;

providing a power amplifier having an input terminal to which said first amplified communication signal is applied and having an output terminal at which a second amplified communication signal is generated, said power amplifier for amplifying said first amplified communication signal at a second selected level of gain, providing a power control signal;

providing a gain controller having an input coupled to receive said power control signal, having a first output connected to control said first level of gain of said variable gain amplifier, and having a second output connected to control a level of bias current applied to said power amplifier;

said first output of said gain controller operating to vary said first level of gain by which said variable gain amplifier amplifies the communication signal as a function of said power control signal; and said gain controller operating to vary said second level of gain by which said power amplifier amplifies said first amplified communication signal by varying said level of bias current applied to said power amplifier as a function of said power control signal;

wherein said step of providing said power control signal includes the steps of:

providing said power control signal as power control bits; and providing memory that stores values of said power control bits and corresponding first levels of gain of said variable gain amplifier and corresponding levels of bias current of said power amplifier.

* * * * *

UNITED STATES PATENT AND TRADEMARK OFFICE
CERTIFICATE OF CORRECTION

PATENT NO. : 6,178,313 B1 Page 1 of 1
APPLICATION NO. : 09/223984
DATED : January 23, 2001
INVENTOR(S) : Mages et al.

It is certified that error appears in the above-identified patent and that said Letters Patent is hereby corrected as shown below:

Column 9,

Line 20, cancel "collection".

Signed and Sealed this

Twenty-sixth Day of August, 2008

JON W. DUDAS
*Director of the United States Patent and Trademark Office*